United States Patent [19]

Hascicek et al.

[11] Patent Number: 5,464,813
[45] Date of Patent: Nov. 7, 1995

[54] METHOD OF PRODUCING SUPERCONDUCTOR WHICH EXHIBITS CRITICAL CURRENT DENSITY BIFURCATION

[75] Inventors: Yusuf S. Hascicek; Louis R. Testardi, both of Tallahassee, Fla.

[73] Assignee: Florida State University, Tallahassee, Fla.

[21] Appl. No.: 152,322

[22] Filed: Nov. 15, 1993

Related U.S. Application Data

[62] Division of Ser. No. 644,175, Jan. 22, 1991, Pat. No. 5,286,710.

[51] Int. Cl.$^6$ .................................................. H01J 39/12
[52] U.S. Cl. ........................ 505/490; 264/61; 264/65; 264/66; 505/500
[58] Field of Search .................................... 505/300, 482, 505/490, 491, 500; 264/65, 66, 61

[56] References Cited

U.S. PATENT DOCUMENTS

| | | | |
|---|---|---|---|
| 3,750,153 | 7/1973 | Testardi | 340/173.1 |
| 4,971,946 | 11/1990 | Taylor et al. | 505/1 |
| 4,983,571 | 1/1991 | Rao et al. | 505/1 |
| 5,079,217 | 1/1992 | Leary | 505/1 |
| 5,232,904 | 8/1993 | Wenger et al. | 505/1 |

OTHER PUBLICATIONS

Einger et al., "Direct Observation of Electric Anisotropy in Single–Crystal YBa(2)Cu(3)O(7–x)", Physical Review Letters, vol. 58, No. 25, Jun. 22, 1987, pp. 2687–2690.
Jin et al., "High Critical Currents in Y–Ba–Cu–O Superconductors", Appl. Phys. Lett., vol. 52, No. 24, Jun. 13, 1988, pp. 2074–2076.
Hascicek et al., "Transport Critical Current Densities of Partially Aligned Bulk Samples of YBa(2)Cu(3)O(7–x) Superconductors", J. Appl. Phys., vol. 68, No. 8, Oct. 15, 1990 pp. 4178–4182.
Chaudari et al., "Critical–Current Measurements in Epitaxial Films of YBa(2)Cu(3)O(7–x) Compound", Physical Review Letters, vol. 58, No. 25, Jun. 22, 1987, pp. 2684–2686.
Dwir et al., "Evidence for Enhancement of Critical Current by Intergrain Ag in YBaCuO–Ag Ceramics", Appl. Phys. Lett. vol. 55, No. 4, Jul. 24, 1989, pp. 399–401.
Masato Murakami et al., "A New Process with the Promise of High Jc in Oxide Superconductors", Jap. Jour. of Applied Physics, vol. 28, No. 7, Jul. 1989, pp. 1189–1194.
Nojima et al., "Galvanomagnetic Effect of an Y–Ba–Cu–O Ceramic Superconductor and its Application to Magnetic Sensors", Jap. Jour. of Applied Physics, vol. 27, No. 5, May 1988, pp. 746–750.
Adrian et al., "The New Superconductors", C & EN, Dec. 21, 1992, pp. 24–41.

Primary Examiner—Christopher A. Fiorilla
Attorney, Agent, or Firm—Senniger, Powers, Leavitt & Roedel

[57] ABSTRACT

A process for the production of a $YBa_2Cu_3O_{7-x}$ or $YBa_2Cu_3O_{7-x}$–AgO superconductor includes: providing the appropriate powder or mix of powders, pressing the powder to form the desired specimen, sintering the specimen to achieve fusion of the powder, heat treating the sintered specimen, and subjecting the specimen to an oxygenation process. The material exhibits bifurcation in its critical current density versus temperature curve.

4 Claims, 7 Drawing Sheets

MARKER DENOTES 20 μm

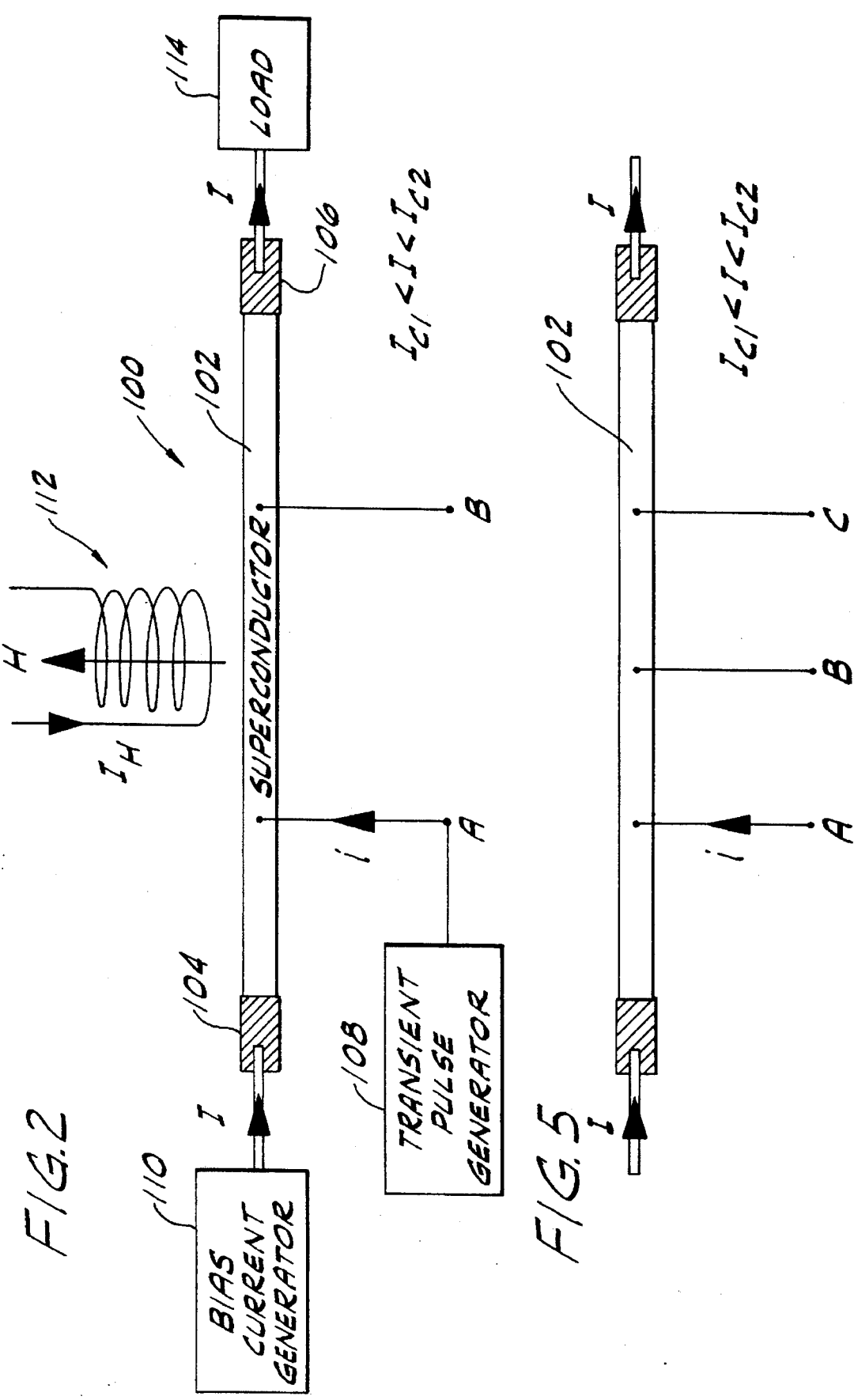

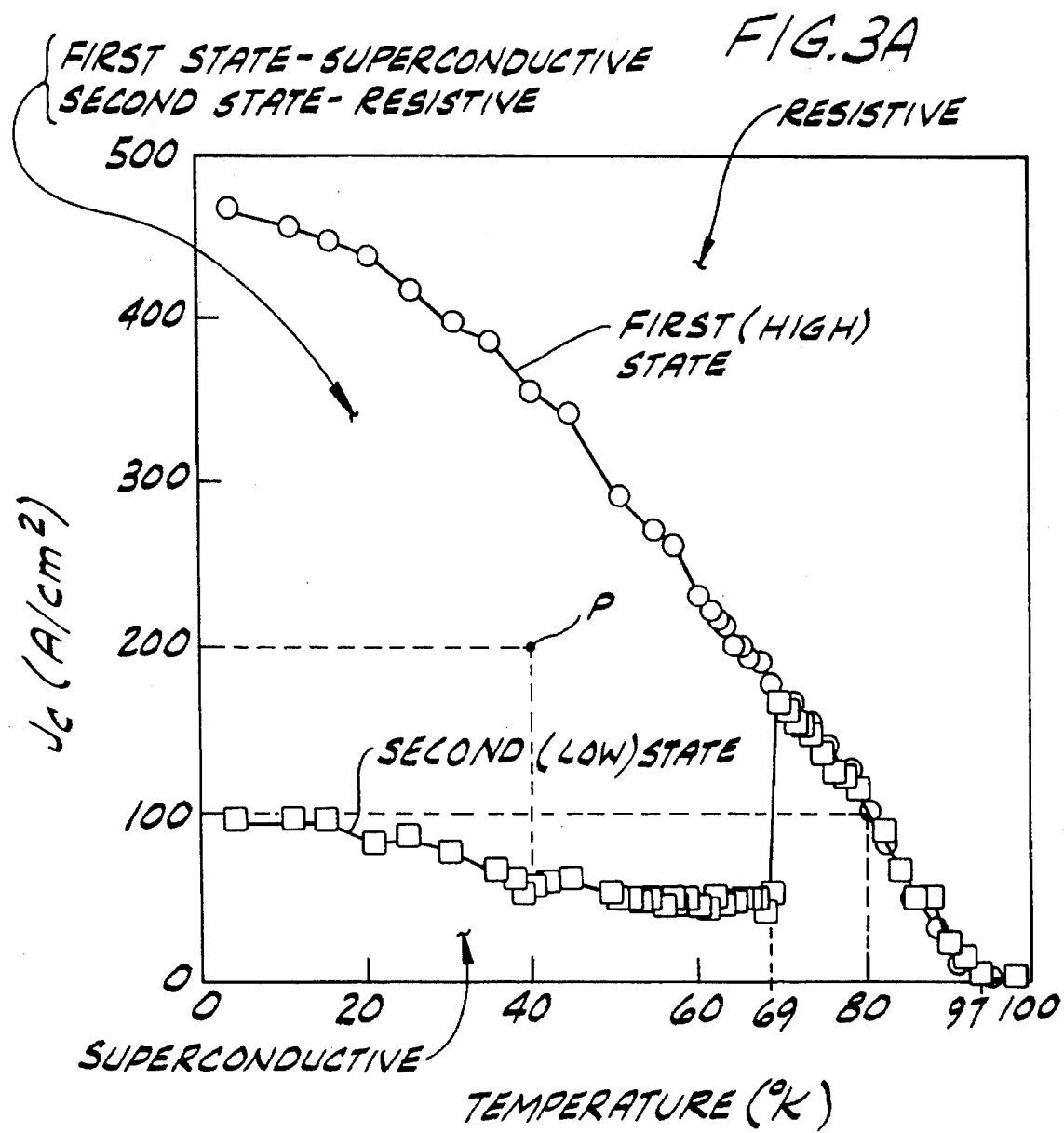

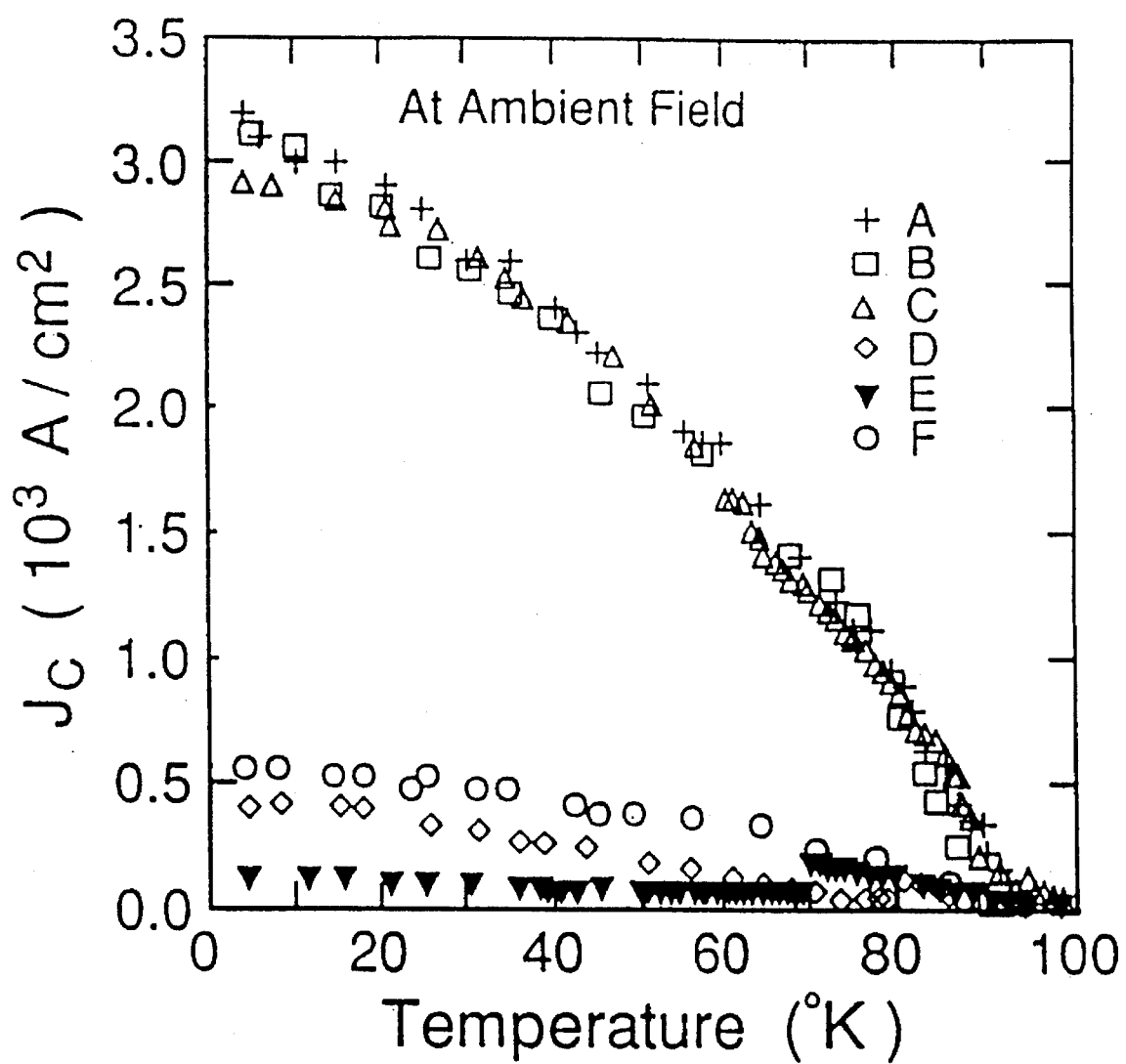

METHOD OF PRODUCING SUPERCONDUCTOR WHICH EXHIBITS CRITICAL CURRENT DENSITY BIFURCATION

This is a division of application Ser. No. 07/644,175, filed Jan. 22, 1991, now U.S. Pat. No. 5,286,710.

BACKGROUND OF THE INVENTION

The invention generally relates to superconductive compounds and, in particular, high temperature superconductive compounds exhibiting both a superconductive state and a resistive state, the particular state in which the compounds exist being controllable, such as by the application of either transient current pulses or magnetic field pulses to the compounds.

Switching devices are well known in the prior art. For example, a Josephson junction device is a structure formed of two (usually thin film) superconductors separated, in all cases, by a very thin (less than a millionth of an inch) insulator. This device shows a nonlinear and hysteretic current-voltage behavior which can be used for switching small amounts of current, and storing information with small amounts of energy. It also exhibits great sensitivity to magnetic fields. These devices are currently used in commercially available equipment to measure weak magnetic fields (where they exceed all other devices in sensitivity), and in experimental prototypes of new, high speed computers.

There is a need for a structure of monolithic superconducting material, such as a rod or patterned thin film path, which can be caused to exhibit switching, storage, and erasure effects. There is also a need for a switching device which differs from the Josephson junction device in structure and area of application. Regarding structure, there is a need for a switching device which avoids the need for insulators and microscopic dimensions. Regarding area of application, there is a need for a switching device having a low electrical impedance which can be controlled by varying length and cross sectional area so that such a device can be utilized to carry large amounts of current or utilized to present very small electrical impedances.

There is also a need for a process for the production of a superconducting material which can be changed from a superconductive state to a resistive state.

SUMMARY OF THE INVENTION

It is an object of this invention to provide a device which can be switched from a resistive to a superconductive state, and vice versa.

It is another object of this invention to provide a device which can be caused to be in either a superconductive or a resistive state so that the device may be used to exhibit switching, storage and erasure effects.

It is another object of this invention to provide a high temperature superconductive material which can be changed from a superconductive state to a resistive state, and visa versa, by the application of a transient current pulse or magnetic field pulse.

It is another object of this invention to provide a material having both superconductive and resistive states, either of which can be maintained without the need for external currents or magnetic fields.

It is another object of this invention to provide a process for the production of a superconducting material which exhibits both a superconductive state and a resistive state.

It has been discovered that an anomalous bifurcation in the critical current density ($J_c$) versus temperature curves of certain $YBa_2Cu_3O_{7-x}$ and $YBa_2Cu_3O_{7-x}$-Ag samples is introduced by the exposure of the samples to a transient pulse. A process has been discovered to produce a superconducting material which exhibits this bifurcation in the $J_c$ versus temperature curves of bulk polycrystalline $YBa_2Cu_3O_{7-x}$ and $YBa_2Cu_3O_{7-x}$-Ag specimens. The process for preparing specimens of $YBa_2Cu_3O_{7-x}$ involves pressing of $YBa_2Cu_3O_{7-x}$ powder into a sinterable shape, sintering the compressed material at about 900° C. for about 12 hours under an oxygen flow of about 100 cc/minute, then heat treating the sintered material at a temperature greater than about 920° C. for about 12 hours under an oxygen flow of about 150 cc/minute and subjecting the material to an oxygenation process at about 450° C. for 5 hours under an oxygen flow of about 150 cc/minute. The process for $YBa_2Cu_3O_{7-x}$-Ag is similar except that sintering occurs at about 850° C. and heating at about at least 870° C.

In one form, the invention comprises a device having superconductive and resistive states. The device includes an element comprising a superconductive material having a first (high) state with a first (high) critical current density and having a second (low) state with a second (low) critical current density. The second (low) critical current density is less than the first (high) critical current density. Means applies a transient pulse to the element. The transient pulse changes the state of the element between the first (high) and second (low) states. The element is superconductive in the first (high) state and is resistive in the second (low) state.

BRIEF DESCRIPTION OF THE DRAWINGS

FIG. 2 is a schematic diagram of a four port device according to the invention.

FIGS. 3A, 3B and 3C are graphs of critical current density ($J_c$) along the ordinate and temperature (°K.) along the abscissa of curves which illustrate the bifurcated states of the compound according to the invention.

FIG. 5 is a schematic diagram of a five port device used as a shift register according to the invention.

Other objects and features will be in part apparent and in part pointed out hereinafter.

DETAILED DESCRIPTION OF THE PREFERRED EMBODIMENTS

The process of preparation of the superconductory material according to the invention will be described first. Commercial $YBa_2Cu_3O_{7-x}$ powder of about 1 µm. particle size was pressed under 40,000 psi to form 1 inch diameter disk-shaped specimens. These disks were placed on alumina support plates and sintered at 900° C. for 12 hours under an oxygen flow of 100 cc/minute. Six bar-shaped samples 0.5×0.8×24 mm³ were cut from these disks using a standard diamond wheel. Four silver paste contact pads were formed on each sample for current and voltage leads. The specimens were then separately heat treated for 12 hours under an oxygen flow of 150 cc/minute at the following temperatures: 900° C. (specimen A), 910° C. (B), 920° C. (C), 930° C. (D), 940° C. (E) and 950° C. (F). It is believed that an oxygen flow of greater than 100 cc/minute during this heat treatment is required in order to obtain the desired results. The specimens were then subjected to an oxygenation process at 450° C. for 5 hours under an oxygen flow of 150 cc/minute. The specimens D, E and F, which had been heat treated at 930° C., 940° C. and 950° C. exhibited bifurcation temperatures between 69° K. and 85° K. The samples which had been heat treated below 930° C. did not exhibit bifurcation in the Jc versus temperature curves.

Additional samples were produced by the following method. Commercial YBa2Cu3O7-x powder of about 1 μm. particle size was dry mill mixed with laboratory grade AgO powder by means of an Agate Vial Mill. The resulting $YBa_2Cu_3O_{7-x}$ -15 wt % Ag powder was pressed under 40,000 psi to form 1 inch diameter disk-shaped specimens. These disks were sintered at 850° C. for 12 hours under an oxygen flow of 100 cc/minute. Bar shaped samples were cut from these disks using a standard diamond wheel. Four silver paste contact pads were formed on each sample for current and voltage leads. The specimens were then separately heat treated under an oxygen flow of 150 cc/minute at the following temperatures: 850° C., 860° C., 870° C., 880° C., 890° C., and 920° C. The specimens were then subjected to an oxygenation process at 450° C. for 5 hours under an oxygen flow of 150 cc/minute. The specimens which were heat treated in the range of 870° C. to 920° C. exhibited bifurcation temperatures in the range of 70° K. to 85° K. The samples which had been heat treated below 870° C. did not exhibit bifurcation in the Jc versus temperature curves.

Although the above-mentioned sintering, heat treating and oxygenating temperatures, times and oxygen flow rates have been shown to produce the desired results for these particular superconducting materials, it is contemplated that other values for these parameters may produce the desired results in the processing of these or other materials.

Figure 1A:
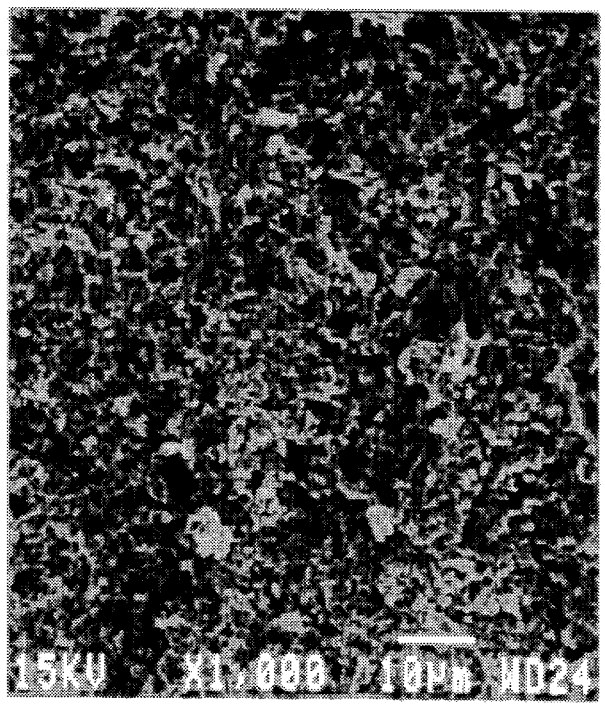
FIGS. 1A, 1B, 1C and 1D are reproductions of photographs showing optical micrographs of polished and fractured surfaces of the compound according to the invention.
Figure 1B:
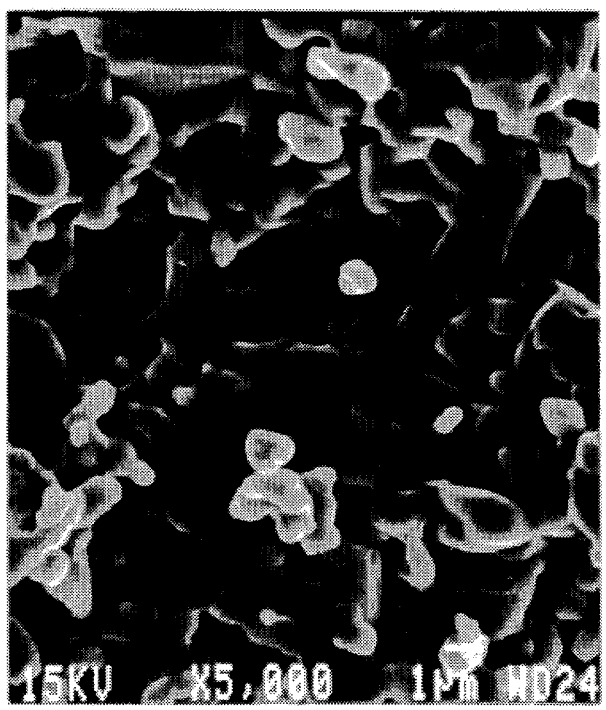
Figure 1C:
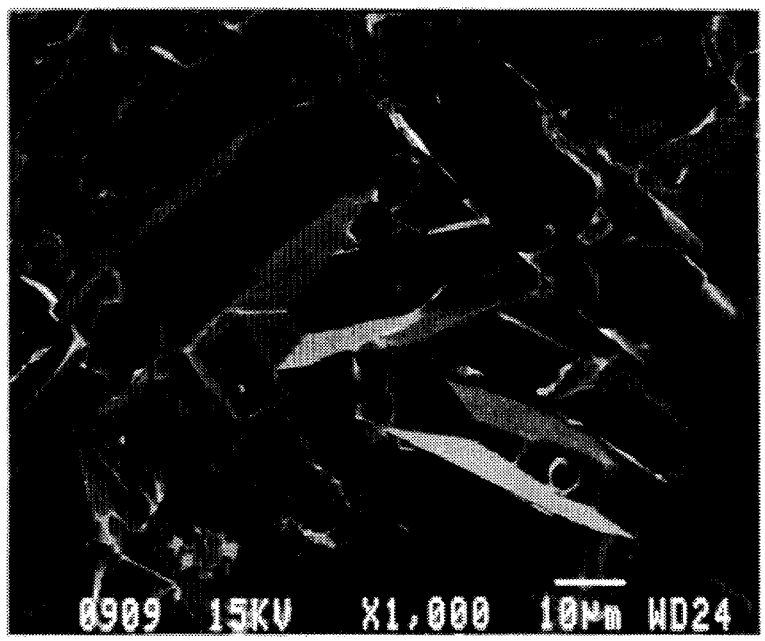
Figure 1D:
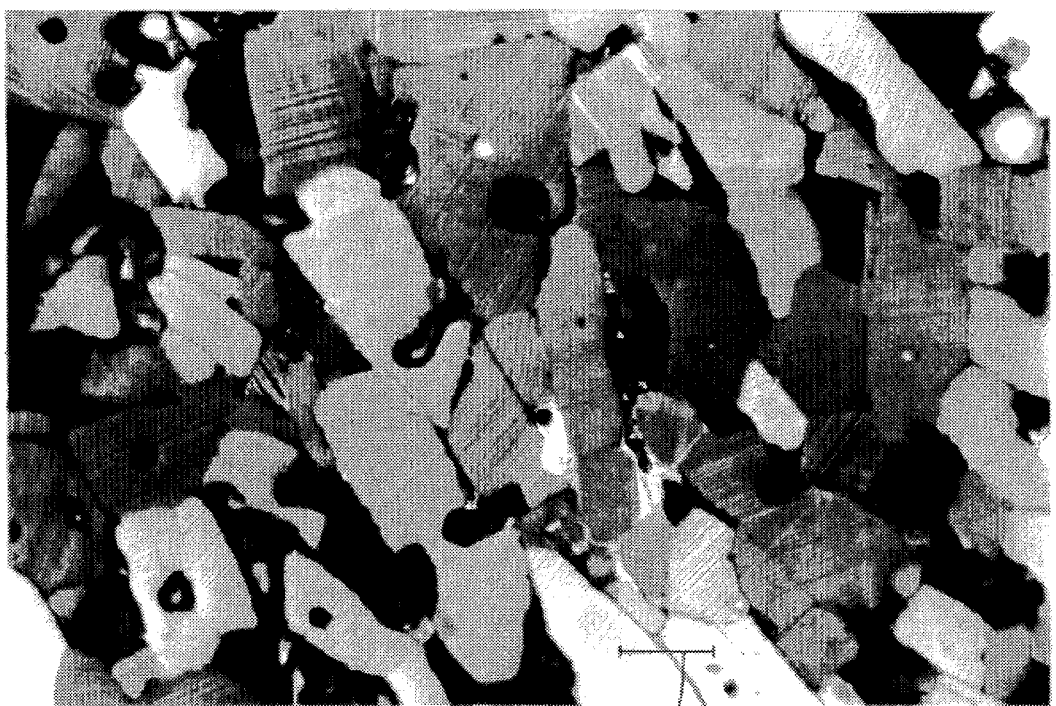

A computer controlled DC pulse technique with a four probe arrangement was used to determine $J_c$ under varying conditions. Optical microscopy, scanning electron microscopy, EDS and WDS analysis and X-ray diffraction studies were carried out to determine microstructure, composition and phases present in these samples. FIGS. 1A through 1D are reproductions of optical photomicrographs of $YBa_2Cu_3O_{7-x}$ samples. FIGS. 1A and 1B show SEM pictures of a fracture surface of sample A, one of the $YBa_2Cu_3O_{7-x}$ samples. FIG. 1C shows a fracture surface of sample E, one of the $YBa_2Cu_3O_{7-x}$ samples whose final heat treatment temperature was about 50° C. higher than that of sample A. As seen from these figures, apart from increasing average grain size with increasing final heat treatment temperature, there is also platelet like grain growth, rather than equiaxed grain growth in these samples. As the final annealing temperature goes up, the pore density decreases. Starting grain size in the powder for all samples A through F was 1 μm. The grain size in sample A was about 1 μm, however, whereas the grain size in sample F was about 50 μm. Micro probe (WDS) analyses show that the grains in all the samples have stoichiometric composition. The samples subjected to higher final heat treatment temperatures occasionally show CuO and $Y_2BaCuO_x$ in very small quantities at the grain boundaries. These additional phases are indicated by arrows in FIG. 1D.

Figure 3C:
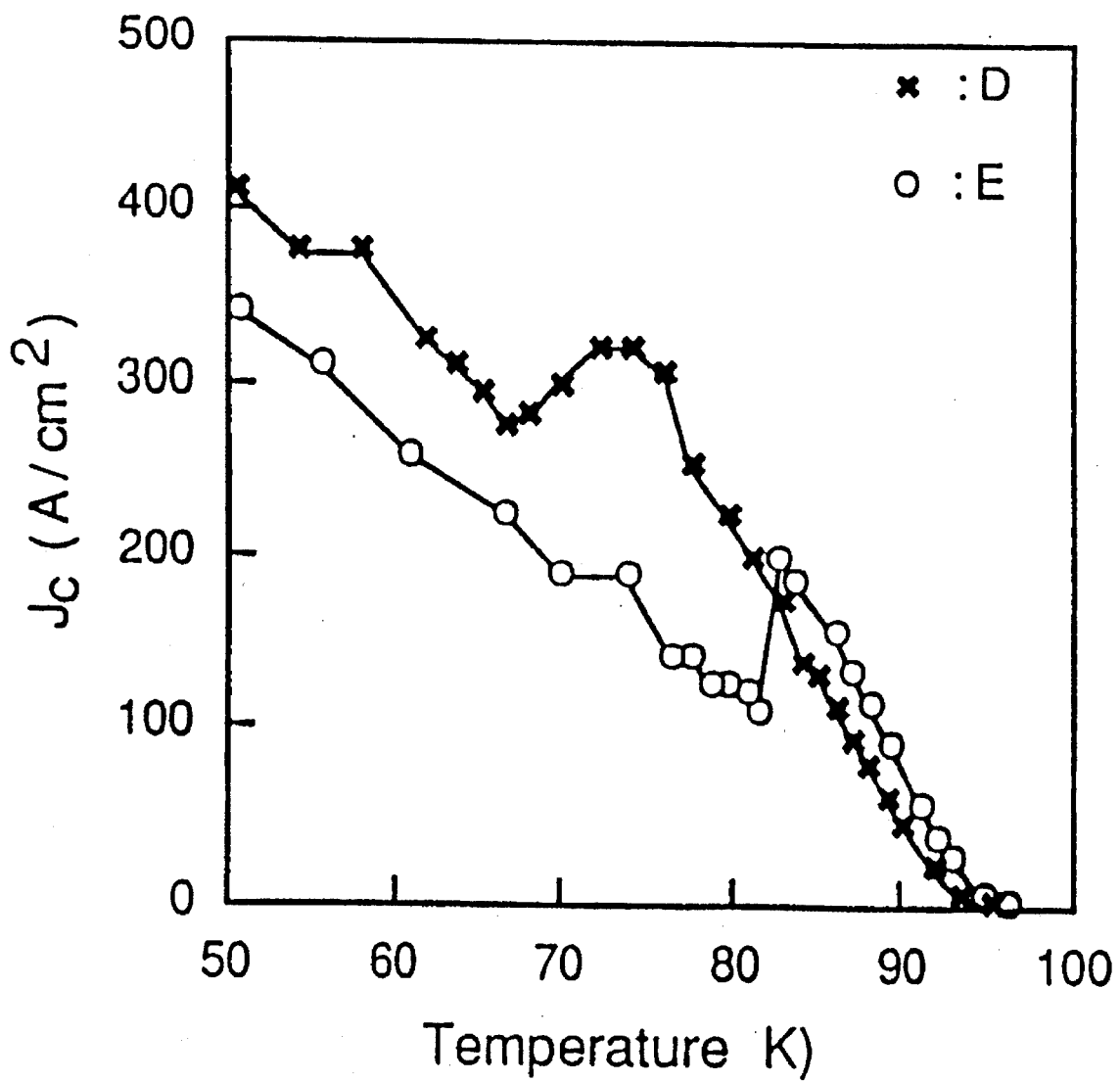

FIG. 3B shows critical current density ($J_c$) versus temperature curves for all the samples of $YBa_2Cu_3O_{7-x}$ A, B, C, D, E and F as marked. As seen from this figure sample A, B and C do not show bifurcation in their $J_c$-T curves but D, E and F do. For clarity only the lower branch of the bifurcated $J_c$-T curves are shown here. FIG. 3B shows the full $J_c$-T behavior for a sample. SEM investigations show platelet like grain growth and some grain boundary phase present in the samples with bifurcation. This grain boundary phase is identified to be CuO and $Y_2BaCuO_x$ by WDS analysis, and tends to run along the grain boundaries across quite few grains (see FIG. 1D). This may suggest that the transient pulse may set up persistent current loops in certain parts of the sample which might well be separated by the grain boundary phase.

Referring to FIG. 2, a schematic diagram of a four-port device 100 according to the invention is illustrated. A conductor 102 is made of an element formed from the high temperature superconductive material of the invention. In general, such materials as a yttrium, barium or thallium based high temperature superconducting compounds are appropriate. In particular, $YBa_2Cu_3O_{7-x}$ and $YBa_2Cu_3O_{7-x}$-Ag have been found to exhibit a bifurcated $J_c$-T curve. The material is formed into a conductor 102 and has an input connector 104 at one end thereof and an output connector 106 at the other end thereof. Although the connectors are generally referred to as input and output connectors, one skilled in the art will readily recognize that either connector may be an input connector with the other functioning as an output connector so that various configurations of the invention are apparent. Intermediate of the two connectors are input ports A and B. Connected to input port A is a transient pulse generator 108 which controls the operating state of the conductor 102. Ports A and B might be located at positions 104 and 106 such that the four port device is in effect a two port device.

Referring to FIG. 3A, a graph of curves representing the critical current density ($J_c$) in amperes per centimeter squared (A/CM$^2$) along the ordinate and the temperature in degrees Kelvin (K) along the abscissa of the bifurcated states of the material of the invention is plotted. Above a bifurcating temperature of 69° K., the material has only a single critical current density curve so that the material functions as a high temperature, superconductive type of material. In general, the critical current density is defined as the current density in a superconductive material above which the material is normal (or resistive) and below which the material is superconducting, at a specified temperature and in the absence of external magnetic fields. For example, at 80° K., the material functions as a resistive material above a current density of about 100 A/CM$^2$ and functions as a superconductive material below that point. However, at a temperature below the bifurcating temperature of about 69° K., the critical current density of the material has two curves. Below the bifurcating temperature, the material may operate in a first (high) state as indicated by circles or the material may operate in a second (low) state as indicated by squares. Above the bifurcating temperature, the curves essentially coincide. Which state the material operates in depends on its temperature, the current density being applied to it and a transient pulse which has been applied to it by the transient pulse generator 108.

Figure 4A:
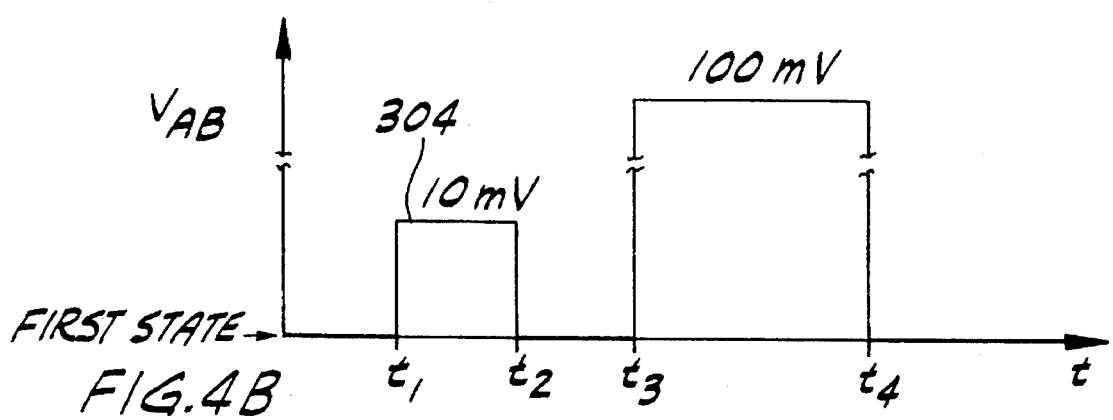
FIGS. 4A, 4B and 4C are graphs of time along the abscissa and of voltage across ports A and B, of current injected into port A and of current injected in the magnetic coil along the ordinate, respectively.
Figure 4B:
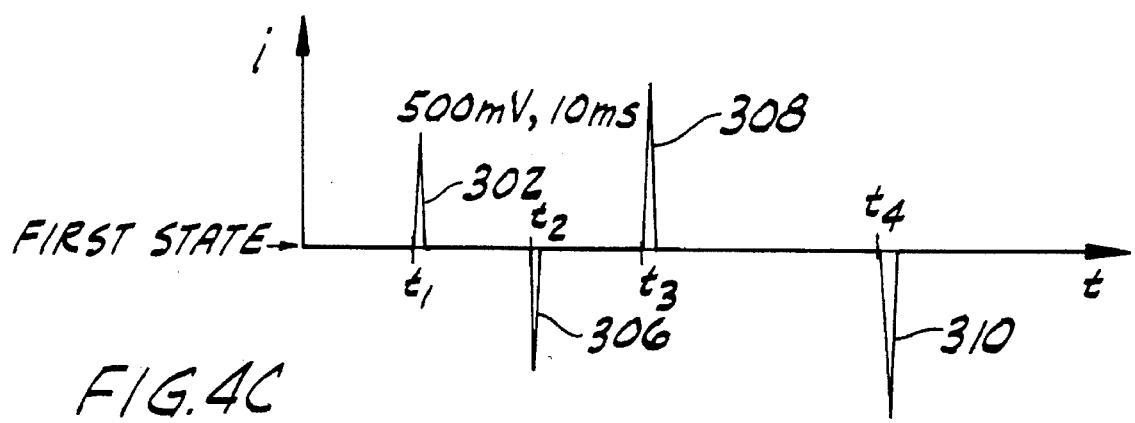
Figure 4C:
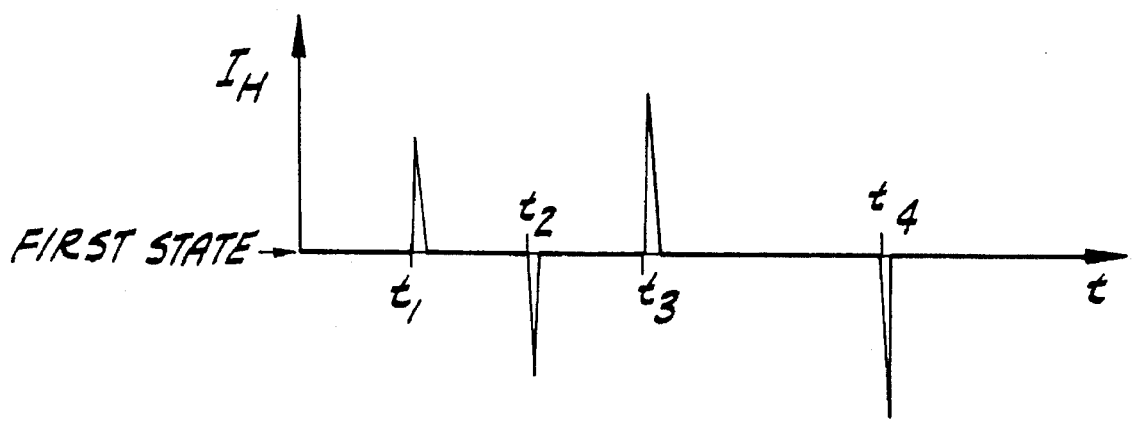

FIGS. 4A, 4B and 4C illustrate how the states of conductor 102 may be controlled. In general, when the material is cooled to below the bifurcating temperature, it will normally be in the first state. Assuming that the bias current generator 110 is applying a current having a current density below the first state curve of FIG. 3A, the material will be superconductive. For example, suppose the material is at 40° K. and is subjected to a biasing current of 200 A/CM$^2$. Referring to FIG. 3A, the material would be operating at a point P. Since this point P is below the first state curve, the material would be functioning as a superconductive material.

Referring now to FIGS. 4A and 4B, energizing transient pulse generator 108 to inject a transient pulse 302 applied to port A at time $t_1$ results in the material changing from the first state to the second (low) state. As compared to the second state, operating point P is above the critical current density curve of the second state so that the material is now functioning as a resistive material causing a voltage drop 304 between ports A and B. It has been found that the conductor 102 will maintain the state that it is in, e.g., the second state, as long as the bias current generated by generator 110 is applied to the conductor 102. It is also possible that the bias current may be such as to function as the injected transient current pulse.

Conductor 102 will stay in the second state until a negative transient pulse 306 at time $t_2$ is applied to it at which point the material will return to the first state and will become superconductive. It has been found that the amplitude and duration of the transient pulse control the state in which the conductor 102 functions. In general, there is a minimum transient pulse required to force the material to change states. Once this minimum pulse is applied to conductor 102, the material will immediately become resistive and provide a potential difference across ports A and B. Accordingly, there is an effective step or jump in the resistivity of the material once this minimum effective transient pulse is applied to the conductor 102. If a larger transient pulse 308 is applied to the conductor 102 at time $t_3$, the resistivity of the conductor 102 will increase significantly to create even a greater potential difference between ports A and B. It is believed that the material will reach a maximum resistive state above which a larger pulse will not effect the resistivity of the conductor 102. Once the conductor 102 has been forced to this higher level, an equivalent negative transient pulse will have to be applied to the conductor 102 to force it back to its first state, such as illustrated by reference character 310.

It is contemplated that the conductor 102 may be in a magnetic coupling relation with a magnetic coil 112 having a magnetic field vector H perpendicular to the direction of flow of current through the material conductor 102. In such a case, a transient current pulse may be applied to the coil 112 in the form of a current $I_H$ which causes a magnetic field pulse to induce a transient into the conductor 102 thereby changing its state. This magnetic field pulse may be used to change the material from its first state to its second state or from its second state to its first state. In addition, magnetic coil 112 may be used in place of the bias current generator 110 to maintain the state of the conductor 102.

In FIG. 3A, the areas bounded by the curves illustrating the states have been labeled to indicate the operating state of the material. In the area above the first state curve, the material functions in a resistive mode. In the area below the second state curve and below the bifurcating temperature and in the area below the first state curve and above the bifurcating temperature, the material functions in a superconductive mode. In the area below the bifurcating temperature and between the curves of first and second states, the material functions in either a superconductive mode or a resistive mode depending on the state it is in which depends upon the last transient pulse applied thereto.

Referring again to FIG. 2, the use of the material as a switch will be described. In general, a load 114 may be connected to connector 106 to be driven by the bias current generator 110 which applies a current having a current density between the first and second state curves. In such an arrangement, conductor 102 functions as a switch in the following manner. In the first state, the conductor 102 is superconductive so that current is being applied to load 114. In contrast, in the second state, the conductor 102 is resistive so that the bias current is being blocked by conductor 102 and the load 114 is not being driven by the bias current generator 110. For example, the conductor may be used to control the flow of persistent current in a superconducting magnet. The conductor 102 may be used in place of a heat switch of a superconducting magnet. Generally, in superconducting magnets there are two coils, a cold coil and a warm coil. The cold coil is closed on itself and current is injected into it to create the magnetic field. Current is initially pumped into the warm coil and then injected, via a heat switch, into the cold coil. It is contemplated that the conductor 102 may be used between the warm coil and the cold coil to inject current from the warm coil into the cold coil.

These resistive/superconductive states of the material also permit the material to function as a memory element. For example, the first state may correspond to one state in a binary system and the second state may correspond to the other state of a binary system. As a result, the bias current applied to the conductor 102 can be used to determine the state of the conductor 102. Once the conductor 102 is placed in a particular state, it maintains that state until a pulse is applied to it to change its state thereby permitting it to be used as a memory element.

FIG. 5 illustrates the use of the material 102 as a shift register. In this configuration, three ports A, B and C are located along the elongated axis of the conductor 102. The particular ports that are used to transmit the transient pulse determines the various states of the portions of the material between ports A, B, C of conductor 102. As a result, the conductor 102 functions as a shift register in the following manner. The portion of the conductor between ports A and B is considered one element or memory cell of the shift register and the portion of the conductor between elements B and C is considered another element or memory cell of the shift register. If a first pulse is applied between port A and port B, the portion of the conductor 102 between ports A and B will change state to resistive while the portion of the conductor between B and C will not change state and will remain superconductive. Thereafter, if a second pulse of opposite polarity to the first pulse is applied between port A and port C, the state between A and B would be reversed or erased and the state between B and C would be changed. The net effect would be as if the information stored between ports A and B is shifted to the portion between ports B and C.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A process for producing a polycrystalline superconducting material which exhibits bifurcation of its critical current density versus temperature curve, said process comprising:

pressing a superconductive yttrium, barium and copper oxide powder, wherein the molar ratio of yttrium:barium:copper is 1:2:3, to form a specimen having a sinterable shape;

sintering said specimen for about 12 hours under an oxygen flow of about 100 cc/minute at a temperature of about 900° C.;

after sintering, heat treating said specimen for about 12 hours under an oxygen flow of greater than about 100 cc/minute at a temperature in the range of 930° C. to 950° C.;

subjecting said specimen to an oxygenation process for about 5 hours under an oxygen flow of about 150 cc/minute at a temperature of about 450° C.

2. A process according to claim 1 wherein said heat treating occurs under an oxygen flow of about 150 cc/minute.

3. A process for producing a polycrystalline superconducting material which exhibits bifurcation in its critical current density ($J_c$) versus temperature curve, said process comprising:

mixing a superconductive yttrium, barium and copper oxide powder, wherein the molar ratio of yttrium:barium:copper is 1:2:3, with AgO powder to form a a powder mixture;

pressing said powder mixture to form a specimen having a sinterable shape;

sintering said specimen for about 12 hours under an oxygen flow of about 100 cc/minute at a temperature of about 850° C.;

after sintering, heat treating said specimen for about 12 hours under an oxygen flow of greater than about 100 cc/minute at a temperature in the range of 870° C. to 920° C.;

subjecting said specimen to an oxygenation process for about 5 hours under an oxygen flow of about 150 cc/minute at a temperature of about 450° C.

4. A process for producing a polycrystalline superconducting material which exhibits bifurcation of its critical current density versus temperature curve, said process comprising:

pressing a powder mixture of AgO powder and a superconductive yttrium, barium and copper oxide powder, wherein the molar ratio of yttrium:barium:copper is 1:2:3, to form a specimen having a sinterable shape;

sintering said specimen at a temperature of about 850° C.;

after sintering, heat treating said specimen having said sinterable shape at a temperature greater than about 870° C.;

subjecting said specimen to an elevated temperature oxygenation process.

* * * * *

UNITED STATES PATENT AND TRADEMARK OFFICE
CERTIFICATE OF CORRECTION

PATENT NO. : 5,464,813

DATED : November 7, 1995

INVENTOR(S) : Yusuf S. Hascicek, Louis R. Testardi

It is certified that error appears in the above-identified patent and that said Letters Patent is hereby corrected as shown below:

In column 1,
insert the following paragraph:

--This invention was made with Government support under DARPA Grant MDA 972-88-51006 awarded by the Defense Advanced Research Projects Agency.--

Signed and Sealed this

Twenty-first Day of September, 1999

*Attest:*

Q. TODD DICKINSON

*Attesting Officer*     *Acting Commissioner of Patents and Trademarks*